(12) United States Patent
Tuan et al.

(10) Patent No.: US 8,159,263 B1
(45) Date of Patent: Apr. 17, 2012

(54) PROGRAMMABLE INTEGRATED CIRCUIT WITH VOLTAGE DOMAINS

(75) Inventors: Tim Tuan, San Jose, CA (US); Ronald L. Cline, Tijeras, NM (US); Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 162 days.

(21) Appl. No.: 12/770,559

(22) Filed: Apr. 29, 2010

(51) Int. Cl.
*H03K 19/173* (2006.01)
(52) U.S. Cl. ............................ 326/38; 326/40; 326/68
(58) Field of Classification Search .............. 326/63, 326/68, 81, 83, 86, 38–41; 327/333
See application file for complete search history.

(56) References Cited

U.S. PATENT DOCUMENTS

| | | | |
|---|---|---|---|
| 6,774,696 B2 * | 8/2004 | Clark et al. ................... | 327/333 |
| 7,005,900 B1 | 2/2006 | Nguyen | |
| 7,098,689 B1 | 8/2006 | Tuan et al. | |
| 7,345,507 B1 | 3/2008 | Young et al. | |
| 7,498,192 B1 | 3/2009 | Goetting et al. | |
| 7,498,835 B1 | 3/2009 | Rahman et al. | |
| 7,498,836 B1 | 3/2009 | Tuan | |
| 7,498,839 B1 | 3/2009 | Jenkins, IV | |
| 7,504,854 B1 | 3/2009 | Look et al. | |
| 7,549,139 B1 | 6/2009 | Tuan et al. | |
| 7,581,124 B1 | 8/2009 | Jacobson et al. | |
| 7,581,131 B1 * | 8/2009 | Prasad et al. .................. | 713/401 |
| 7,583,126 B2 * | 9/2009 | Yang et al. .................... | 327/333 |
| 7,667,487 B2 * | 2/2010 | Bartley et al. ................. | 326/38 |
| 7,750,717 B2 * | 7/2010 | Ali et al. ...................... | 327/333 |
| 7,830,175 B1 * | 11/2010 | Lin et al. ..................... | 326/68 |
| 7,852,118 B2 * | 12/2010 | Deutscher et al. ............. | 326/68 |
| 2009/0212842 A1 * | 8/2009 | Illegems et al. ............... | 327/333 |

OTHER PUBLICATIONS

Gayasen, A. et al., "A Dual-VDD Low Power FPGA Architecture," *Proc. of the International Conference on Field Programmable Logic & Applications*, Aug. 30, 2004, pp. 1-10, Springer Verlag, Düsseldorf, Germany.

Li, Fei et al., "FPGA Power Reduction Using Configurable Dual-Vdd," *Proc. of the 41st Annual Design Automation Conference*, Jun. 7, 2004, pp. 735-740, ACM, New York, New York, USA.

Li, Fei et al., "Vdd Programmability to Reduce FPGA Interconnect Power," *Proc. of the 2004 IEEE/ACM International Conference on Computer-aided Design*, Nov. 7, 2004, pp. 760-765, IEEE Computer Society, Washington, DC, USA.

* cited by examiner

*Primary Examiner* — Vibol Tan
(74) *Attorney, Agent, or Firm* — LeRoy D. Maunu (57) ABSTRACT

A programmable integrated circuit having a plurality of individually controlled voltage domains. Each voltage domain includes logic circuitry powered by a respective power network. The voltage magnitude of each power network is independently selectable. Each of a plurality of level shifters couples a first and second one of the voltage domains, couples a first port of the logic circuitry of the first voltage domain to a second port of the logic circuitry of the second voltage domain, and shifts from a first signaling protocol of the first port to a second signaling protocol of the second port. The first signaling protocol is referenced to the voltage magnitude of the first voltage domain, and the second signaling protocol is referenced to the voltage magnitude of the second voltage domain. Means are disclosed for controlling the voltage magnitude of the respective power network of one or more of the voltage domains.

20 Claims, 6 Drawing Sheets

PROGRAMMABLE INTEGRATED CIRCUIT WITH VOLTAGE DOMAINS

FIELD OF THE INVENTION

The present invention generally relates to integrated circuits with voltage domains, and more particularly to integrated circuits programmable to control an operating condition of the voltage domains.

BACKGROUND

Integrated circuits can be fabricated for a variety of general and application-specific purposes. Defects may be introduced in the fabrication of integrated circuits, and these defects reduce the production yield of working integrated circuits from the fabrication process. The production yield of the fabrication process directly affects the cost of fabricating working integrated circuits.

The power consumption of an integrated circuit directly affects the cost of operating the integrated circuit. Because leakage current frequently contributes a significant component to the power consumption of an integrated circuit, the power consumption of an integrated circuit can be significant even when the integrated circuit is quiescent. The cost of operating an integrated circuit can be improved by reducing the operating or quiescent power consumption of the integrated circuit.

The present invention may address one or more of the above issues.

SUMMARY

The various embodiments of the invention provide a programmable integrated circuit with individually controlled voltage domains. In one embodiment, the programmable integrated circuit includes a plurality of voltage domains each including logic circuitry powered by a respective power network. A voltage magnitude of the respective power network of each voltage domain is independently selectable for specifying a tradeoff between performance and power consumption of the logic circuitry in the voltage domain. Each of a plurality of level shifters couples a first and second one of the voltage domains, couples a first port of the logic circuitry of the first voltage domain to a second port of the logic circuitry of the second voltage domain, and shifts from a first signaling protocol of the first port to a second signaling protocol of the second port. The first signaling protocol is referenced to the voltage magnitude of the respective power network powering the logic circuitry of the first voltage domain, and the second signaling protocol is referenced to the voltage magnitude of the respective power network powering the second voltage domain. The programmable integrated circuit includes means for controlling the voltage magnitude of the respective power network of one or more of the voltage domains.

In another embodiment, the means for controlling the voltage magnitude of the respective power network of one or more of the voltage domains includes means for independently controlling the voltage magnitude of the respective power network of each of the voltage domains for specifying the tradeoff between performance and power consumption of the logic circuitry in the voltage domain, and means for independently controlling a voltage bias of a substrate of each of the voltage domains for specifying the tradeoff between performance and power consumption of the logic circuitry in the voltage domain.

A programmable integrated circuit in another embodiment includes a plurality of semiconductor dies including a plurality of respective voltage domains. Each voltage domain includes logic circuitry powered by a respective power network. A voltage magnitude of the respective power network of each voltage domain is independently selectable for specifying a tradeoff between performance and power consumption of the logic circuitry in the voltage domain. Each of a plurality of level shifters couples a first and second one of the voltage domains, couples a first port of the logic circuitry of the first voltage domain to a second port of the logic circuitry of the second voltage domain, and shifts from a first signaling protocol of the first port to a second signaling protocol of the second port. The first signaling protocol is referenced to the voltage magnitude of the respective power network powering the logic circuitry of the first voltage domain, and the second signaling protocol is referenced to the voltage magnitude of the respective power network powering the second voltage domain. A semiconductor interposer couples the plurality of semiconductor dies and provides a plurality of power ports for independently controlling the voltage magnitude of the respective power network of each voltage domain.

In another embodiment, the logic circuitry in one of the voltage domains is active during a first time interval and inactive during a second time interval. The power ports set the voltage magnitude of the respective power network of the voltage domain to an operating voltage magnitude for achieving proper performance of the logic circuitry throughout the first time interval. The power ports set the voltage magnitude to a standby voltage magnitude within the second time interval. Power consumption during the second time interval by the logic circuitry in the voltage domain is lower than the power consumption of the logic circuitry if the voltage magnitude was instead set to the operating voltage magnitude throughout the second time interval.

The logic circuitry in a first one of the voltage domains of the programmable integrated circuit, in another embodiment, requires a first level of performance and the logic circuitry in a second one of the voltage is non-critical logic circuitry requires a second level of performance that is lower than the first level of performance. The power ports set the voltage magnitude of the respective power network of the first voltage domain to a first voltage magnitude for achieving the first level of performance of the critical logic circuitry. The power ports further set the voltage magnitude of the respective power network of the second voltage domain to a second voltage magnitude for achieving the second level of performance at a power consumption of the non-critical logic circuitry. The power consumption of the non-critical logic circuitry is lower than a power consumption of the non-critical logic circuitry if the voltage magnitude for the second voltage domain was instead set to the first voltage magnitude.

The semiconductor die for each voltage domain, in another embodiment, includes a generator of a voltage bias of a substrate of the semiconductor die, and the generator controls the voltage bias of the substrate for specifying a tradeoff between performance and power consumption of the logic circuitry in the voltage domain.

In another embodiment, the logic circuitry in one of the voltage domains is active during a first time interval and inactive during a second time interval. The generator sets the voltage bias of the substrate of the semiconductor die of the voltage domain to an operating bias for achieving proper performance of the logic circuitry throughout the first time interval. The generator sets the voltage bias to a standby bias within the second time interval. The logic circuitry in the voltage domain has power consumption during the second time interval that is lower than the power consumption of the logic circuitry if the voltage bias was instead set to the operating bias throughout the second time interval.

The logic circuitry in a first one of the voltage domains is critical logic circuitry in another embodiment and requires a first level of performance. The logic circuitry in a second one of the voltage is non-critical logic circuitry and requires a second level of performance that is lower than the first level of performance. The generator in the first voltage domain sets the voltage bias of the substrate of the semiconductor die of the first voltage domain to a first operating bias for achieving the first level of performance of the critical logic circuitry. The generator in the second voltage domain sets the voltage bias of the substrate of the semiconductor die of the second voltage domain to a second operating bias for achieving the second level of performance. The power consumption of the non-critical logic circuitry at the second level of performance is lower than the power consumption of the non-critical logic circuitry if the voltage bias for the second voltage domain was instead set to the first operating bias.

In another embodiment, for each of the level shifters, the semiconductor interposer couples the first port of the logic circuitry in the semiconductor die of the first voltage domain via the level shifter to the second port of the logic circuitry in the semiconductor die of the second voltage domain.

For two of the semiconductor dies, another embodiment provides the first and second voltage domains for each level shifter, and the level shifter is provided by at least one of the two semiconductor dies.

A programmable integrated circuit in another embodiment includes a plurality of voltage domains, each including logic circuitry powered by a respective power network. A voltage magnitude of the respective power network of each voltage domain is independently selectable for specifying a tradeoff between performance and power consumption of the logic circuitry in the voltage domain. Each of a plurality of level shifters couples a first and second one of the voltage domains, couples a first port of the logic circuitry of the first voltage domain to a second port of the logic circuitry of the second voltage domain, and shifts from a first signaling protocol of the first port to a second signaling protocol of the second port. The first signaling protocol is referenced to the voltage magnitude of the respective power network powering the logic circuitry of the first voltage domain, and the second signaling protocol is referenced to the voltage magnitude of the respective power network powering the second voltage domain. A configuration device specifies at least one power state for the voltage domains. Each power state is independently selected from a plurality of power states including at least a powered state and a non-powered state. A selector is coupled to at least one of the voltage domains and the configuration device. For each voltage domain that is coupled to the selector, the selector selects the voltage magnitude corresponding to the at least one power state to the respective power network of the voltage domain.

In another embodiment, the logic circuitry in the voltage domains includes a plurality of programmable logic and interconnect resources, and each level shifter couples the first port of the programmable logic resources in the first voltage domain via the programmable interconnect resources to the second port of the programmable logic resources in the second voltage domain.

Each level shifter, in another embodiment, includes a half-latch powered by the respective power network of the second voltage domain. The half-latch includes an inverter and a PMOS pull-up transistor. The first port is coupled via at least one pass transistor of the programmable interconnect resources to an input of the inverter. An output of the inverter is coupled to the second port and a gate of the PMOS pull-up transistor, and a channel electrode of the PMOS pull-up transistor is coupled to the input of the inverter.

In another embodiment, the at least one pass transistor electrically decouples the respective power networks of the first and second voltage domains, causing the inverter and the PMOS pull-up transistor to drive the input of the inverter to the voltage magnitude of the respective power network of the second voltage domain, in response to the first node driving the voltage magnitude of the respective power network of the first voltage domain and in response to a gate voltage magnitude of the at least one pass transistor being less than a sum of a threshold voltage magnitude of the at least one pass transistor and the voltage magnitude of the respective power network of the first voltage domain.

In the powered state for the voltage domain, in another embodiment the selector sets the voltage magnitude of the respective power network of the voltage domain to an operating voltage magnitude for achieving proper performance of the logic circuitry in the voltage domain. In the unpowered state for the voltage domain, the selector sets the voltage magnitude of the respective power network of the voltage domain to a grounded voltage magnitude for eliminating power consumption of the logic circuitry in the voltage domain.

In another embodiment, the configuration device includes a fuse device having an electrically alterable resistance. For each voltage domain that is coupled to the selector, the fuse device selects the powered state in response to the electrically alterable resistance being less than a threshold resistance. The fuse device selects the unpowered state in response to the electrically alterable resistance being more than the threshold resistance.

The fuse device, in another embodiment, is configured to select the unpowered state in response to the voltage domains that are coupled to the selector having a fabrication defect that precludes proper performance of the logic circuitry in these voltage domains.

The configuration device includes a predetermined one of a plurality of available interposers in another embodiment. A first one of the available interposers selects the powered state for each of the voltage domains, and a second one of the available interposers selects the unpowered state for each of at least one of the voltage domains.

In another embodiment, for each level shifter that couples the first port of the first voltage domain to the second port of the second voltage domain, the level shifter includes an isolation circuit that disables the first port in response to the first voltage domain having the unpowered state.

Each of the voltage domains, in another embodiment, is disposed within at least one isolation well of a semiconductor of the programmable integrated circuit. Associated with each of the voltage domains is a generator of a voltage bias for the at least one isolation well of the voltage domain. The generator controls the voltage bias of the at least one isolation well of the voltage domain for specifying a tradeoff between performance and power consumption of the logic circuitry in the voltage domain.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
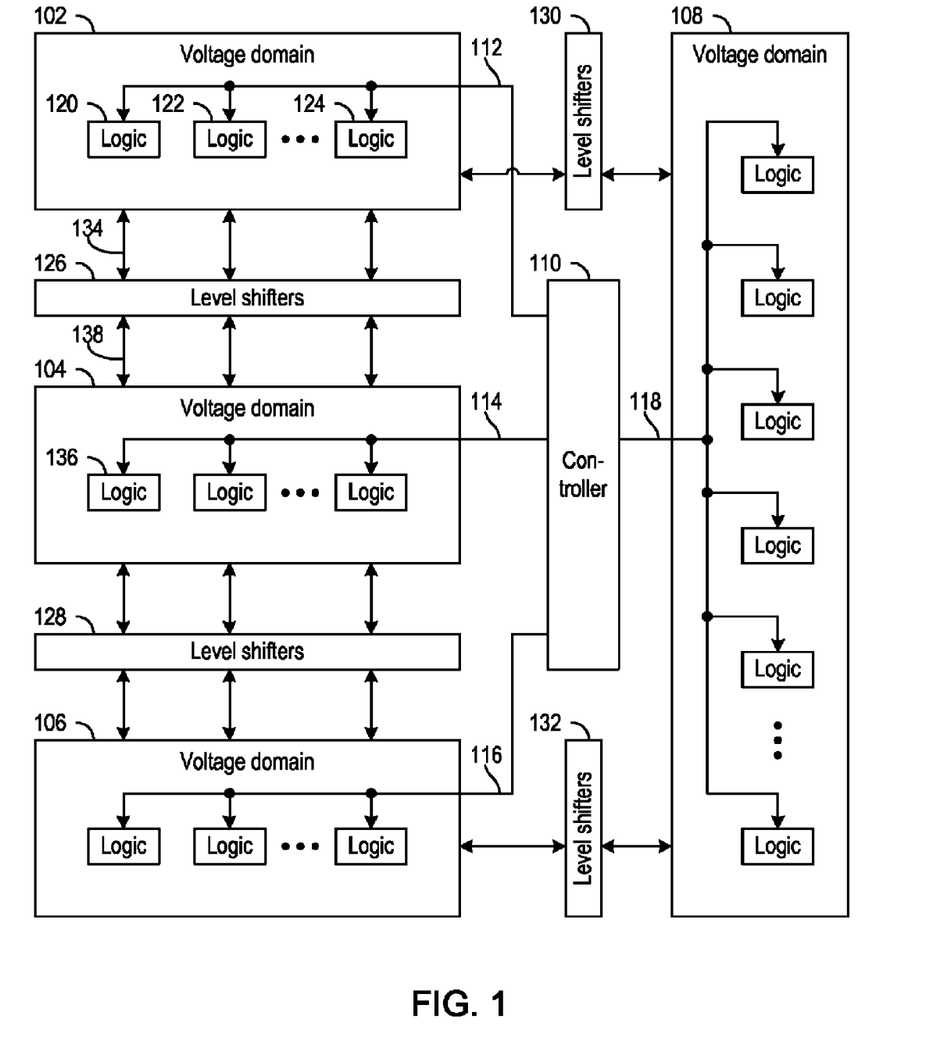
FIG. 1 is a block diagram of a programmable integrated circuit having voltage domains in accordance with one or more embodiments of the invention.

FIG. 1 is a block diagram of a programmable integrated circuit having voltage domains 102, 104, 106, and 108 in accordance with one or more embodiments of the invention. The magnitudes of the voltages applied to some or all of the respective voltage domains 102, 104, 106, and 108 are independently selectable to trade off performance and power consumption of logic circuitry in these voltage domains. For example, a voltage domain could be powered with either a low or high voltage magnitude, with the low voltage magnitude providing low power consumption and low performance for the voltage domain, and the high voltage magnitude providing high power consumption and high performance for the voltage domain. To reduce power consumption, the low voltage magnitude powers each voltage domain unless high performance is required from the voltage domain.

Controller 110 controls the voltage domains. In one embodiment, controller 110 independently selects the voltage magnitudes applied to the power networks on lines 112, 114, 116, and 118. Voltage domain 102 includes logic circuitry 120, 122, and 124 powered by the voltage magnitude from power network 112, and voltage domains 104, 106, and 108 similarly include logic circuitry powered by the voltage magnitude from respective power networks 114, 116, and 118. Thus, controller 110 controls the voltage magnitude powering the logic circuitry in the voltage domains 102, 104, 106, and 108. In another embodiment, controller 110 provides means for controlling the voltage magnitude of the power networks on lines 112, 114, 116, and 118 for some or all of the voltage domains 102, 104, 106, and 108.

Level shifters 126, 128, 130, and 132 couple certain pairings of the voltage domains 102, 104, 106, and 108 to compensate for different signaling protocols of the voltage domains. For example, logic circuitry 120 drives the output port on line 134 between logic levels referenced to the voltage magnitude provided on power network 112 and logic circuitry 136 evaluates the input port on line 138 for logic levels referenced to the voltage magnitude provided on power network 114, and level shifters 126 shift the signaling protocol of the output port on line 134 to the signaling protocol of the input port of line 138. Thus, levels shifters 126 permit successful data communication between logic circuitry 120 and logic circuitry 136, even when controller 110 powers voltage domains 102 and 104 with different voltage magnitudes.

Figure 2:
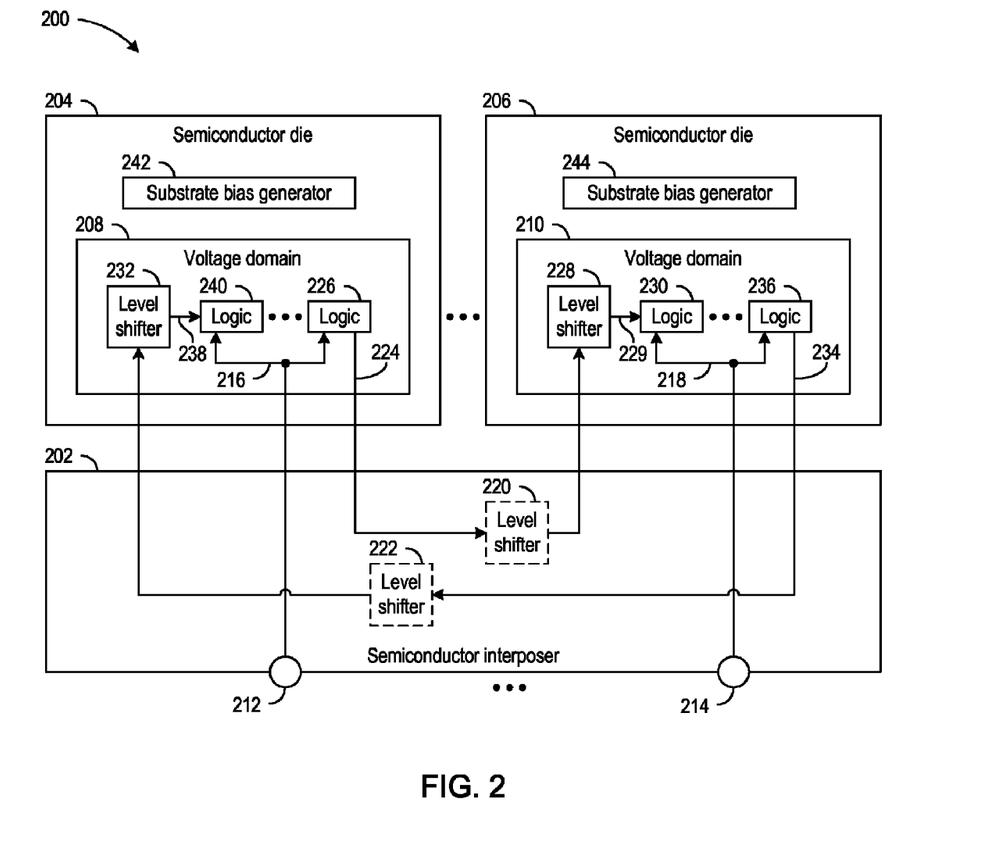
FIG. 2 is a block diagram of a programmable integrated circuit using a semiconductor interposer to control semiconductor dies having voltage domains in accordance with one or more embodiments of the invention.

FIG. 2 is a block diagram of a programmable integrated circuit 200 using a semiconductor interposer 202 to control semiconductor dies 204 through 206 having voltage domains 208 and 210 in accordance with one or more embodiments of the invention. In one embodiment, the semiconductor dies 204 through 206 and the semiconductor interposer 202 are the same type of semiconductor, such as silicon, to match thermal expansion coefficients between these components of the programmable integrated circuit 200.

A single defect often makes a large semiconductor die completely inoperable, while the same defect generally affects only one of many small semiconductor die having the same total area as the large semiconductor die. Thus, semiconductor fabrication yield improves dramatically by assembling a large integrated circuit 200 from small semiconductor dies 204 through 206 that are already tested to verify correct operation. Because generally the semiconductor interposer 202 does not have appreciable active area, its fabrication yield is very high. However, the yield for assembling the semiconductor dies 204 through 206 on semiconductor interposer 202 does affect the overall yield for the large integrated circuit 200.

In one embodiment, the semiconductor interposer 202 has power ports 212 through 214, and semiconductor interposer 202 connects power port 212 to power network 216 of voltage domain 208 of semiconductor die 204 and semiconductor interposer 202 connects power port 214 to power network 218 of voltage domain 210 of semiconductor die 206. Each semiconductor die 204 through 206 provides a voltage domain powered by a corresponding power network, which semiconductor interposer 202 connects to a respective power port 212 through 214. Thus, semiconductor interposer 202 provides power ports 212 through 214 for independently controlling the voltage magnitude supplied to respective power networks of semiconductor dies 204 through 206. It will be appreciated that power ports 212 through 214 can each include multiple power pins of the programmable integrated circuit 200.

In one example, some of logic circuitry 240 through 226 is critical and needs a high level of performance and the logic circuitry 230 through 236 is non-critical and needs a low level of performance. External power regulators set power port 212 to a voltage magnitude giving the high level of performance for logic circuitry 240 through 226. The external power regulators also set power port 214 to a voltage magnitude giving the low level of performance for logic circuitry 230 through 236 while reducing power consumption, as compared to the power consumption of logic circuitry 230 through 236 when power port 214 is instead set to a voltage magnitude for achieving high performance. It will be appreciated that the external power regulators can dynamically change the voltage magnitude supplied to power ports 212 and/or 214 if the corresponding logic circuitry has interleaved time intervals requiring high and low levels of performance.

In another embodiment, semiconductor interposer 202 has fewer power ports 212 through 214 than the number of semiconductor dies 204 through 206. For example, semiconductor interposer 202 has two power ports 212 and 214, and connects power port 212 to a power network for one half of the semiconductor dies 204 through 206 and connects power port 214 to another power network for the other half of the semiconductor dies 204 through 206. Thus, a particular voltage domain can span one or more of the semiconductor dies 204 through 206 depending upon the particular semiconductor interposer 202 selected from the available interposers. The available interposers provide varying degrees of independent or constrained control over the voltage magnitude supplied to the power networks of the semiconductor dies 204 through 206.

In one embodiment, the semiconductor interposer 202 includes interconnect wiring and no active circuits. In this embodiment, the semiconductor interposer 202 omits the optional level shifters 220 and 222, and instead the semiconductor interposer 202 connects the output port on line 224 of the logic circuitry 226 of voltage domain 208 to the level shifter 228. Level shifter 228 converts the signaling protocol of the output port on line 224 to the signaling protocol of the input port on line 229 of the logic circuitry 230 of the voltage domain 210. Similarly, level shifter 232 converts the signaling protocol of the output port on line 234 of logic circuitry 236 of voltage domain 210 to the signaling protocol of the input port on line 238 of the logic circuitry 240 of the voltage domain 208.

In another embodiment, level shifters 228 and 232 are replaced with level shifters 220 and 222 that are implemented in active circuitry of the semiconductor interposer 202. In general, those skilled in the art will recognize that the level shifters may be included in the destination voltage domain (as shown with level shifters 228 and 232), in the source voltage domain (not shown), or outside the destination and source voltage domains (as shown with level shifters 220 and 222). In other embodiments, it may be desirable to implement each level shifter in circuitry that is distributed across the semiconductor interposer 202 and the source and destination semiconductor dies 204 and 206.

In one embodiment, the substrates of the semiconductor dies 204 through 206 are electrically isolated from each other. Semiconductor die 204 includes a bias generator 242 for generating a voltage bias for the substrate of the semiconductor die 204 and semiconductor die 206 includes a bias generator 244 for generating another voltage bias for the substrate of semiconductor die 206. The voltage bias magnitudes applied to the substrates for the voltage domains 208 and 210 are independently selectable to trade off performance and power consumption of logic circuitry in these voltage domains. For example, the logic circuitry 240 through 226 in voltage domain 208 may be temporarily unused during a particular time interval, and during this time interval power port 212 reduces the supply voltage magnitude and bias generator 242 generates a strong negative voltage bias to reduce power consumption in a standby operating mode.

In another embodiment, bias generators 242 and 244 are instead implemented in the semiconductor interposer 202.

In certain embodiments, semiconductor interposer 202 is a means for controlling the voltage magnitude of the power networks on lines 216 and 218 for some or all of the voltage domains 208 through 210, and bias generators 242 and 244 are means for independently controlling a voltage bias of a substrate of each of the voltage domains 208 through 210.

Figure 3:
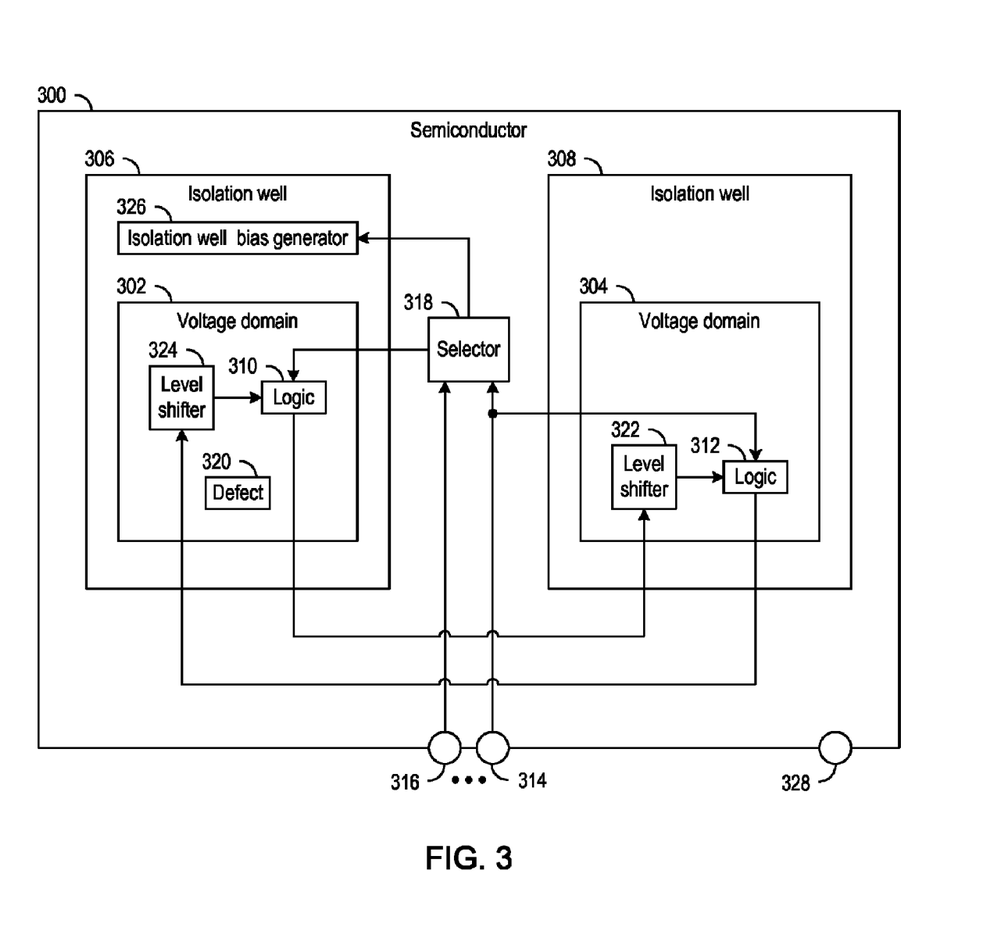
FIG. 3 is a block diagram of a programmable integrated circuit that controls voltage domains in accordance with one or more embodiments of the invention.

FIG. 3 is a block diagram of a programmable integrated circuit 300 that controls voltage domains 302 and 304 in accordance with one or more embodiments of the invention. A triple-well semiconductor fabrication process can provide isolation wells 306 and 308 in addition to wells for CMOS circuitry. Alternatively, isolation wells 306 and 308 can be electrically insulated portions of a semiconductor fabricated on an insulator.

Logic circuitry 310 is implemented in voltage domain 302 within isolation well 306, and logic circuitry 312 is implemented in voltage domain 304 within isolation well 308. Isolation wells 306 and 308 permit independent selection of the voltage magnitudes supplying power to the logic circuitry 310 and 312 in voltage domains 302 and 304, and permit independent selection of the voltage bias for the substrate within isolation wells 306 and 308. Independent selection of the magnitudes of these power and bias voltages permits trade-offs between performance and power consumption of the logic circuitry 310 and 312 in voltage domains 302 and 304.

In one embodiment, power ports 314 through 316 supply different voltage magnitudes to selector 318, and selector 318 powers the logic circuitry 310 in voltage domain 302 of isolation well 306 with the voltage magnitude from one of power ports 314 through 316. FIG. 3 also shows selector 318 controlling the voltage magnitude powering the logic circuitry 312 in voltage domain 304 of isolation well 308. While FIG. 3 shows the voltage selector 318 being on the same semiconductor as the voltage domains 302 and 304, in other embodiments the voltage selections may be made off the semiconductor 300. For example, the selector may be implemented on an interposer die, in the packaging, or on a printed circuit board. In these alternative embodiments, the parts of the selector that store the selection (e.g., e-fuse), disable the inactive (e.g., defective) regions, or enable isolation regions may still be on the semiconductor die 300.

In one example, power port 314 supplies a normal operating voltage, and power port 316 supplies a ground voltage. Selector 318 couples the normal operating voltage from power port 314 to the logic circuitry 310 in a normally powered state for voltage domain 302, or selector 318 couples the ground voltage from power port 316 to the logic circuitry 310 in an unpowered state for voltage domain 302.

Selector 318 statically selects an unpowered state for logic circuitry 310 when voltage domain 302 includes a fabrication defect 320 that precludes proper performance of logic circuitry 310. This disables logic circuitry 310 and generally eliminates power consumption of logic circuitry 310, while allowing logic circuitry 312 to operate normally. In one embodiment, programmable integrated circuit 300 can implement two products, a full-function product providing logic circuitry 310 and 312, and a reduced-function product providing only logic circuitry 312. The fabrication yield for these products increases because a programmable integrated circuit 300 having defect 320 still implements the reduced-function product, while a programmable integrated circuit 300 without defect 320 implements either the reduced-function product or the full-function product. Furthermore, the reduced-function product has essentially the expected power consumption because the unpowered state generally eliminates power consumption within voltage domain 302.

In another embodiment, selector 318 statically or dynamically selects a voltage magnitude for logic circuitry 310 corresponding to an enhanced operating state providing high performance at high power consumption, a normal operating state providing moderate performance at moderate power consumption, a standby operating state retaining data stored in logic circuitry 310 at low power consumption, or a disabled operating state having nearly zero power consumption.

Level shifter 322 converts the signaling protocol output from logic circuitry 310 of voltage domain 302 to the signaling protocol input by logic circuitry 312 of the voltage domain 304. Similarly, level shifter 324 converts the signaling protocol output from logic circuitry 312 to the signaling protocol input by logic circuitry 310.

Isolation well 306 includes a bias generator 326 for generating a voltage bias for the substrate within isolation well 306. In one embodiment, selector 318 selects the voltage bias to achieve proper performance in the enhanced and normal operating states, and selector 318 selects the voltage bias to reduce leakage current of the logic circuitry 310 in the standby and disabled operating states.

Selector 318 selects the voltage magnitude for powering logic circuitry 310 and selects the voltage bias for the substrate within isolation well 306 based on a power state statically or dynamically configured, for example, by an input pin 328 of programmable integrated circuit 300 or an internal fuse device of selector 318. Selector 318 can be configured or replaced by one of several available interposers. For example, one interposer has interconnections providing a powered state for voltage domains 302 and 304, and another interposer has interconnections providing the powered state for voltage domain 304 and an unpowered state for voltage domain 302. These interposers could also vary the arrangement of pins between a full-function product powering both logic circuitry 310 and 312, and a reduced-function product powering only logic circuitry 312.

It will be appreciated that a programmable integrated circuit can include many isolation wells and corresponding voltage domains having a selectable voltage magnitude for powering logic circuitry in each voltage domain and a selectable voltage bias for the substrate within an isolation well for each voltage domain.

In certain embodiments, selector 318 is a means for controlling the voltage magnitude of a power network for voltage domain 302, and bias generator 326 is means for controlling a voltage bias of a substrate within the isolation well 306 for voltage domain 302.

Figure 4:
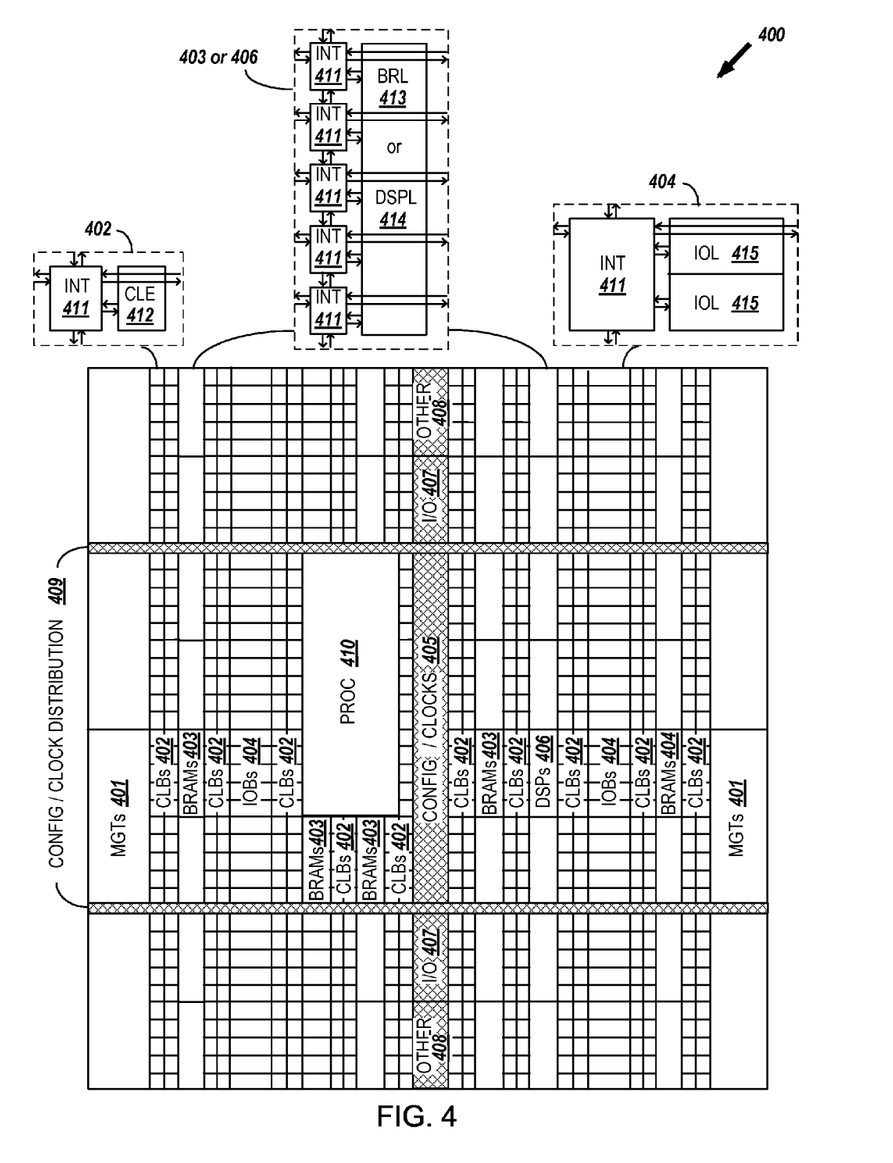
FIG. 4 is a block diagram of a programmable logic integrated circuit that implements voltage domains in accordance with one or more embodiments of the invention.

FIG. 4 is a block diagram of a programmable integrated circuit (IC) implementing voltage domains in accordance with various embodiments of the invention. The example programmable IC is a field programmable gate array (FPGA). In one embodiment, the programmable IC includes programmable tiles and optional processor blocks that are each in a corresponding voltage domain.

Advanced FPGAs can include several different types of programmable logic blocks in the array. For example, FIG. 4 illustrates an FPGA architecture 400 that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

Figure 5:
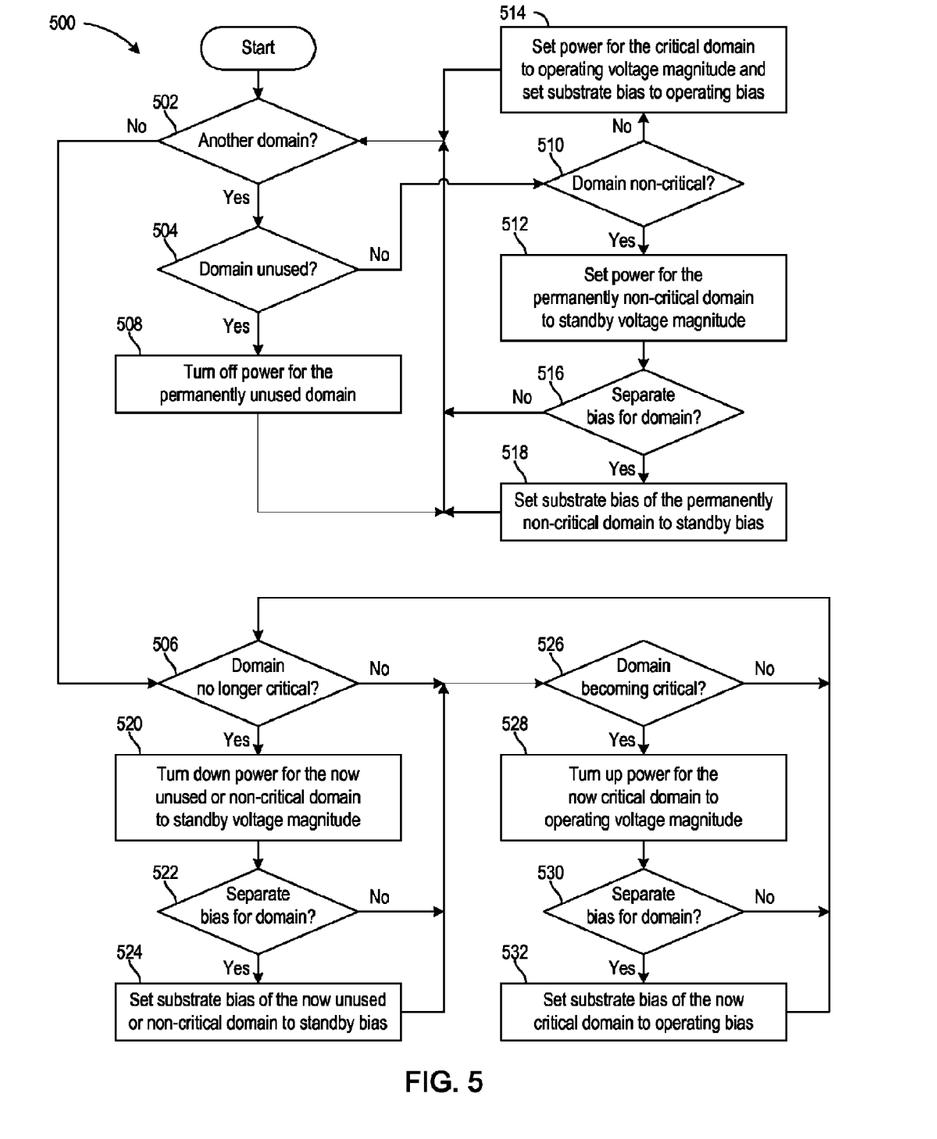
FIG. 5 is a flow diagram of a process for controlling voltage domains in accordance with one or more embodiments of the invention.

FIG. 5 is a flow diagram of a process 500 for controlling voltage domains in accordance with one or more embodiments of the invention. The voltage magnitude supplied to circuitry in the voltage domains and the bias voltage of a substrate of the voltage domains are statically or dynamically configured to trade off performance and power consumption of the circuitry in the voltage domains. It will be appreciated that even though FIG. 5 shows a single flow diagram, in practice, the static portion and the run-time portion may be separate. The static portion may be performed in production, and the run-time or dynamic control, if implemented, would be on the IC or elsewhere in the system. The static control refers to the processing of steps 502, 504, 508, 510, 512, 514, 516, and 518. The dynamic control refers to steps 506, 520, 522, 524, 526, 520, 530, and 532.

Decision 502 checks whether there is another voltage domain needing initial configuration. If there is another voltage domain, process 500 proceeds to decision 504 and otherwise process 500 proceeds to decision 506.

Decision 504 checks whether the current voltage domain is unused. For example, the programmable integrated circuit shown in FIG. 4 can be configured to implement a wide variety of user designs, and a particular user design could leave unused certain ones of the configurable logic blocks (CLBs 402) and corresponding voltage domains for the unused CLBs. At step 508, process 500 disables the supplied voltage magnitude if the current voltage domain is unused, and then process 500 returns to decision 502 to consider the next voltage domain. If the current voltage domain is used, process 500 proceeds to decision 510.

Decision 510 checks whether the current voltage domain is non-critical or critical. A voltage domain is critical when the voltage domain includes logic circuitry on the critical timing paths for a particular user design. If the current voltage domain is non-critical, process 500 proceeds to step 512; otherwise, process 500 proceeds to step 514. At step 512, a standby voltage magnitude powers the non-critical voltage domain. At step 514, an operating voltage magnitude powers the critical voltage domain and an operating voltage bias is applied to the substrate of the critical voltage domain.

Decision 516 checks whether the non-critical voltage domain has a separate control of substrate bias. If the non-critical voltage domain has a separate bias, a standby voltage bias is applied to the substrate of the critical voltage domain at step 518.

Whenever a previously critical voltage domain becomes non-critical or unused, process 500 proceeds from decision 506 to step 520. At step 520, a standby voltage powers the newly non-critical or unused voltage domain. Decision 522 checks whether the voltage domain has a separate control of substrate bias. If the voltage domain has a separate bias, a standby voltage bias is applied to the substrate of the voltage domain at step 524.

Whenever a previously non-critical or unused voltage domain becomes critical, process 500 proceeds from decision 526 to step 528. At step 528, an operating voltage powers the critical voltage domain. Decision 530 checks whether the voltage domain has a separate control of substrate bias. If the newly critical voltage domain has a separate bias, an operating voltage bias is applied to the substrate of the voltage domain at step 532.

Figure 6:
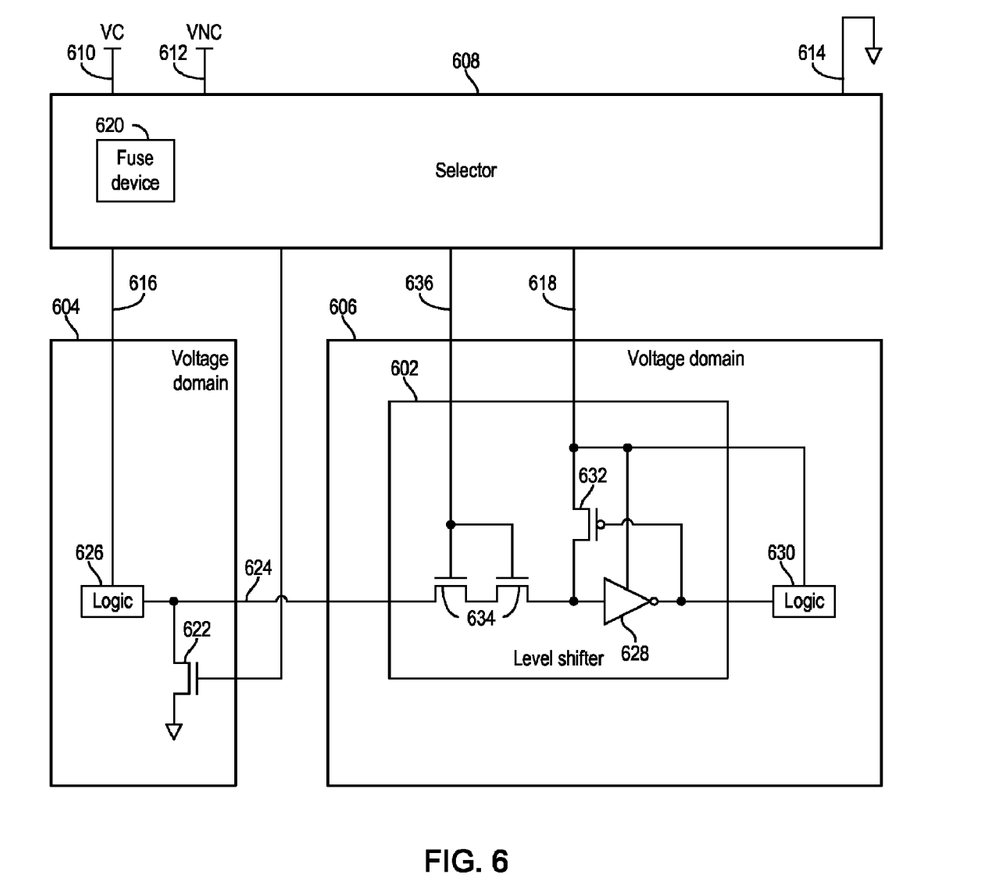
FIG. 6 is a block diagram of a programmable integrated circuit including a level shifter in accordance with one or more embodiments of the invention.

FIG. 6 is a block diagram of a programmable integrated circuit including a level shifter 602 in accordance with one or more embodiments of the invention. Level shifter 602 converts logic levels between voltage domain 604 and voltage domain 606.

Selector 608 receives an operating voltage on line 610 for critical logic circuitry and standby voltage on line 612 for non-critical logic circuitry. Selector 608 also receives a ground voltage on line 614. Depending upon the static or dynamic requirements of voltage domains 604 and 606, selector 608 provides the operating, standby, or ground voltages from lines 610, 612, and 614 to the voltage domains 604 and 606 via respective lines 616 and 618.

In one embodiment, selector 608 includes a fuse device 620, or multiple fuse devices, that specifies the voltage magnitude that selector 608 applies to lines 616 and 618. In one example, fuse device 620 initially has a low resistance that is electrically alterable to a high resistance. Selector 608 applies the operating voltage from line 610 to lines 616 and 618 when fuse device 620 has the initial low resistance, and selector 608 applies the standby voltage from line 612 to lines 616 and 618 when fuse device 620 has the high resistance.

In another example, selector 608 applies the operating voltage from line 610 to both lines 616 and 618 when fuse device 620 has a resistance less than a threshold resistance, and selector 608 applies the ground voltage to line 616 and the operating voltage to line 618 when fuse device 620 has a resistance greater than the threshold resistance. Thus, "blowing" the fuse device 620 disables voltage domain 604 and essentially eliminates power consumption from voltage domain 604, and the programmable integrated circuit implements either a full-function product or a reduced-function product depending on the state of fuse device 620. It will be appreciated that fuse device 620 can also specify a product identifier of the programmable integrated circuit, such as a device identifier accessible via serial scan. In addition, an isolation circuit 622 can disable the output port on line 624 of logic circuitry 626 after blowing fuse device 620 to disable voltage domain 604.

When the operating voltage from line 610 is supplied on line 616 to voltage domain 604 and a low standby voltage from line 612 is supplied on line 618 to voltage domain 606, logic circuitry 626 can readily overdrive inverter 628 to transfer logic values to logic circuitry 630.

In contrast, when the low standby voltage from line 612 is supplied on line 616 to voltage domain 604 and the operating voltage from line 610 is supplied on line 618 to voltage domain 606, logic circuitry 626 inadequately drives inverter 628 when logic circuitry 626 drives a high value referenced to the low standby voltage. However, if inverter 628 is driven sufficiently to begin switching, PMOS pull-up transistor 632 completes pulling the input of inverter 628 up to the operating voltage. Inverter 628 and PMOS pull-up transistor 632 form a half-latch having positive feedback that converts a high level referenced to the low standby voltage to a high level referenced to the operating voltage at the input of inverter 628.

However, a parasitic current path exists when logic circuitry 626 drives a high value referenced to the low standby voltage and inverter 628 and PMOS pull-up transistor 632 convert this to a high value referenced to the operating voltage. This parasitic current path is from the operating voltage on line 618 through the channels of the PMOS pull-up transistor 632 and the pass transistors 634, and through the channel of a PMOS pull-up in logic circuitry 626 to the standby voltage on line 616. In summary, a parasitic current path exists from the operating voltage on line 618 to the low standby voltage on line 616. However, pass transistors 634 block this parasitic current path when pass transistors 634 are not conductive because the gate voltage on line 636 exceeds the standby voltage driven on line 624 by less than the threshold voltage of pass transistors 634. In the illustrated embodiment of FIG. 6, selector 608 drives the gate voltage on line 636 to prevent formation of the parasitic current path. In another embodiment, the gate voltage on line 636 is a predetermined value, and selector 608 includes interlocks to prevent supplying voltages to lines 616 and 618 that enable formation of the parasitic current path.

In one embodiment, the pass transistors 634 are included in one of the programmable interconnect elements (INTs 411) of FIG. 4, and the programmable interconnect element uses the pass transistors 634 to couple an output port of logic circuitry 626 to an input port of logic circuitry 630. The programmable interconnect element includes other pass transistors to selectively couple the output ports of other logic circuitry to the input port of logic circuitry 630. Depending upon the particular user design currently implemented by the programmable logic device, the programmable interconnect element enables certain of the pass transistors to couple the output port of the appropriate logic circuit to the input port of logic circuit 630. In this embodiment, these existing pass transistors are used for the additional purpose of blocking the parasitic current path. Thus, the additional circuitry needed to implement level shifter 602 is merely the half-latch of inverter 628 and PMOS pull-up 632.

The present invention is thought to be applicable to a variety of systems for controlling multiple voltage domains. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable integrated circuit, comprising:
a plurality of voltage domains each including logic circuitry powered by a respective power network;
wherein a voltage magnitude of the respective power network of each voltage domain is independently selectable for specifying a tradeoff between performance and power consumption of the logic circuitry in the voltage domain;
a plurality of level shifters;
wherein each level shifter couples a first and second one of the voltage domains, couples a first port of the logic circuitry of the first voltage domain to a second port of the logic circuitry of the second voltage domain, and shifts from a first signaling protocol of the first port to a second signaling protocol of the second port, the first signaling protocol referenced to the voltage magnitude of the respective power network powering the logic circuitry of the first voltage domain and the second signaling protocol referenced to the voltage magnitude of the respective power network powering the second voltage domain; and a control circuit coupled to the logic circuitry in each of the plurality of voltage domains, the control circuit configured and arranged to independently control the voltage magnitude of the respective power network of each of the voltage domains.

2. The programmable integrated circuit of claim 1, wherein the control circuit is further configured and arranged to independently control a voltage bias of a substrate of each of the voltage domains for specifying the tradeoff between performance and power consumption of the logic circuitry in the voltage domain.

3. A programmable integrated circuit, comprising:

a plurality of semiconductor dies including a plurality of respective voltage domains each including logic circuitry powered by a respective power network;

wherein a voltage magnitude of the respective power network of each voltage domain is independently selectable for specifying a tradeoff between performance and power consumption of the logic circuitry in the voltage domain;

a plurality of level shifters;

wherein each level shifter couples a first and second one of the voltage domains, couples a first port of the logic circuitry of the first voltage domain to a second port of the logic circuitry of the second voltage domain, and shifts from a first signaling protocol of the first port to a second signaling protocol of the second port, the first signaling protocol referenced to the voltage magnitude of the respective power network powering the logic circuitry of the first voltage domain and the second signaling protocol referenced to the voltage magnitude of the respective power network powering the second voltage domain; and a semiconductor interposer coupling the plurality of semiconductor dies, the semiconductor interposer providing a plurality of power ports for independently controlling the voltage magnitude of the respective power network of each voltage domain.

4. The programmable integrated circuit of claim 3, wherein:

the logic circuitry in one of the voltage domains is active during a first time interval and inactive during a second time interval;

the power ports set the voltage magnitude of the respective power network of the voltage domain to an operating voltage magnitude for achieving proper performance of the logic circuitry throughout the first time interval;

the power ports set the voltage magnitude to a standby voltage magnitude within the second time interval; and the logic circuitry in the voltage domain has a power consumption during the second time interval that is lower than a power consumption of the logic circuitry if the voltage magnitude was instead set to the operating voltage magnitude throughout the second time interval.

5. The programmable integrated circuit of claim 3, wherein:

the logic circuitry in a first one of the voltage domains is critical logic circuitry requiring a first level of performance;

the logic circuitry in a second one of the voltage is non-critical logic circuitry requiring a second level of performance that is lower than the first level of performance;

the power ports set the voltage magnitude of the respective power network of the first voltage domain to a first voltage magnitude for achieving the first level of performance of the critical logic circuitry; and the power ports set the voltage magnitude of the respective power network of the second voltage domain to a second voltage magnitude for achieving the second level of performance at a power consumption of the non-critical logic circuitry that is lower than a power consumption of the non-critical logic circuitry if the voltage magnitude for the second voltage domain was instead set to the first voltage magnitude.

6. The programmable integrated circuit of claim 3, wherein:

the semiconductor die for each voltage domain includes a generator of a voltage bias of a substrate of the semiconductor die; and the generator controls the voltage bias of the substrate for specifying a tradeoff between performance and power consumption of the logic circuitry in the voltage domain.

7. The programmable integrated circuit of claim 6, wherein:

the logic circuitry in one of the voltage domains is active during a first time interval and inactive during a second time interval;

the generator sets the voltage bias of the substrate of the semiconductor die of the voltage domain to an operating bias for achieving proper performance of the logic circuitry throughout the first time interval;

the generator sets the voltage bias to a standby bias within the second time interval; and the logic circuitry in the voltage domain has a power consumption during the second time interval that is lower than a power consumption of the logic circuitry if the voltage bias was instead set to the operating bias throughout the second time interval.

8. The programmable integrated circuit of claim 6, wherein:

the logic circuitry in a first one of the voltage domains is critical logic circuitry requiring a first level of performance and the logic circuitry in a second one of the voltage is non-critical logic circuitry requiring a second level of performance that is lower than the first level of performance;

the generator in the first voltage domain sets the voltage bias of the substrate of the semiconductor die of the first voltage domain to a first operating bias for achieving the first level of performance of the critical logic circuitry; and the generator in the second voltage domain sets the voltage bias of the substrate of the semiconductor die of the second voltage domain to a second operating bias for achieving the second level of performance at a power consumption of the non-critical logic circuitry that is lower than a power consumption of the non-critical logic circuitry if the voltage bias for the second voltage domain was instead set to the first operating bias.

9. The programmable integrated circuit of claim 3, wherein, for each of the level shifters, the semiconductor interposer couples the first port of the logic circuitry in the semiconductor die of the first voltage domain via the level shifter to the second port of the logic circuitry in the semiconductor die of the second voltage domain.

10. The programmable integrated circuit of claim 9, wherein, for two of the semiconductor dies providing the first and second voltage domains for each level shifter, the level shifter is provided by at least one of the two semiconductor dies.

11. A programmable integrated circuit, comprising:
a plurality of voltage domains each including logic circuitry powered by a respective power network;
wherein a voltage magnitude of the respective power network of each voltage domain is independently selectable for specifying a tradeoff between performance and power consumption of the logic circuitry in the voltage domain;
a plurality of level shifters;
wherein each level shifter couples a first and second one of the voltage domains, couples a first port of the logic circuitry of the first voltage domain to a second port of the logic circuitry of the second voltage domain, and shifts from a first signaling protocol of the first port to a second signaling protocol of the second port, the first signaling protocol referenced to the voltage magnitude of the respective power network powering the logic circuitry of the first voltage domain and the second signaling protocol referenced to the voltage magnitude of the respective power network powering the second voltage domain;
a configuration device specifying at least one power state for the voltage domains, each power state independently selected from a plurality of power states including at least a powered state and a non-powered state; and
a selector coupled to at least one of the voltage domains and the configuration device;
wherein, for each voltage domain that is coupled to the selector, the selector selects the voltage magnitude corresponding to the at least one power state to the respective power network of the voltage domain.

12. The programmable integrated circuit of claim 11, wherein:
the logic circuitry in the voltage domains includes a plurality of programmable logic and interconnect resources; and
each level shifter couples the first port of the programmable logic resources in the first voltage domain via the programmable interconnect resources to the second port of the programmable logic resources in the second voltage domain.

13. The programmable integrated circuit of claim 12, wherein:
each level shifter includes a half-latch powered by the respective power network of the second voltage domain, the half-latch including an inverter and a PMOS pull-up transistor;
the first port is coupled via at least one pass transistor of the programmable interconnect resources to an input of the inverter;
an output of the inverter is coupled to the second port and a gate of the PMOS pull-up transistor; and
a channel electrode of the PMOS pull-up transistor is coupled to the input of the inverter.

14. The programmable integrated circuit of claim 13, wherein:
the at least one pass transistor electrically decouples the respective power networks of the first and second voltage domains, causing the inverter and the PMOS pull-up transistor to drive the input of the inverter to the voltage magnitude of the respective power network of the second voltage domain, in response to the first node driving the voltage magnitude of the respective power network of the first voltage domain and in response to a gate voltage magnitude of the at least one pass transistor being less than a sum of a threshold voltage magnitude of the at least one pass transistor and the voltage magnitude of the respective power network of the first voltage domain.

15. The programmable integrated circuit of claim 11, wherein:
in the powered state for the voltage domain, the selector sets the voltage magnitude of the respective power network of the voltage domain to an operating voltage magnitude for achieving proper performance of the logic circuitry in the voltage domain; and
in the unpowered state for the voltage domain, the selector sets the voltage magnitude of the respective power network of the voltage domain to a grounded voltage magnitude for eliminating power consumption of the logic circuitry in the voltage domain.

16. The programmable integrated circuit of claim 15, wherein:
the configuration device includes a fuse device having an electrically alterable resistance; and
for each voltage domain that is coupled to the selector, the fuse device selects the powered state in response to the electrically alterable resistance being less than a threshold resistance and the fuse device selects the unpowered state in response to the electrically alterable resistance being more than the threshold resistance.

17. The programmable integrated circuit of claim 16, wherein the fuse device is configured to select the unpowered state in response to the voltage domains that are coupled to the selector having a fabrication defect that precludes proper performance of the logic circuitry in these voltage domains.

18. The programmable integrated circuit of claim 15, wherein:
the configuration device includes a predetermined one of a plurality of available interposers;
a first one of the available interposers selects the powered state for each of the voltage domains; and
a second one of the available interposers selects the unpowered state for each of at least one of the voltage domains.

19. The programmable integrated circuit of claim 15, wherein, for each level shifter that couples the first port of the first voltage domain to the second port of the second voltage domain, the level shifter includes an isolation circuit that disables the first port in response to the first voltage domain having the unpowered state.

20. The programmable integrated circuit of claim 11, wherein:
each of the voltage domains is disposed within at least one isolation well of a semiconductor of the programmable integrated circuit;
associated with each of the voltage domains is a generator of a voltage bias for the at least one isolation well of the voltage domain; and
the generator controls the voltage bias of the at least one isolation well of the voltage domain for specifying a tradeoff between performance and power consumption of the logic circuitry in the voltage domain.

* * * * *